United States Patent [19]

Murakami

[11] 4,228,545
[45] Oct. 14, 1980

[54] RECEIVER DEVICE HAVING A FUNCTION FOR SUPPRESSING TRANSIENT NOISES DURING ABRUPT INTERRUPTIONS

[75] Inventor: Hideyo Murakami, Yokohama, Japan

[73] Assignee: Nippon Telegraph & Telephone Public Corporation, Tokyo, Japan

[21] Appl. No.: 30,977

[22] Filed: Apr. 18, 1979

[30] Foreign Application Priority Data

Apr. 21, 1978 [JP] Japan ............................. 53-46691

[51] Int. Cl.$^2$ ............................................ H04B 1/10
[52] U.S. Cl. ................................. 455/296; 179/1 SC
[58] Field of Search ..................... 325/473, 474, 478; 179/1 SA, 1 SB, 1 SE, 1 SD, 1 P, 1 VC

[56] References Cited

U.S. PATENT DOCUMENTS

| | | | |
|---|---|---|---|
| 3,904,969 | 9/1975 | Eastmond | 325/478 |
| 4,074,069 | 2/1978 | Tokura et al. | 179/1 SC |
| 4,157,457 | 6/1979 | Sakoe et al. | 179/1 SC |

Primary Examiner—Robert L. Griffin
Assistant Examiner—Jin F. Ng
Attorney, Agent, or Firm—Townsend & Townsend

[57] ABSTRACT

A receiver device comprises a demodulator for demodulating speech signals received at an input terminal of the device, a delay memory for storing, with a delay, speech signals of prescribed period for a predetermined time, a detector for detecting an abrupt interruption and its period of the received speech signals, a discriminator for discriminating whether the speech signals stored in the delay memory are periodic or non-periodic, an interpolator for creating interpolating information during the abrupt interruption from the signals stored in the delay memory under the control of the detector by receiving the outputs from the discriminator and the abrupt interruption detector, and a switch which is adapted, under the normal condition, to receive and transmit signals from the demodulator to the output of the device, while it is adapted, under the condition that the abrupt interruption and the period thereof is detected, to select signals from the interpolator and to transmit the selected interpolating signals to the output terminal of the device.

7 Claims, 16 Drawing Figures

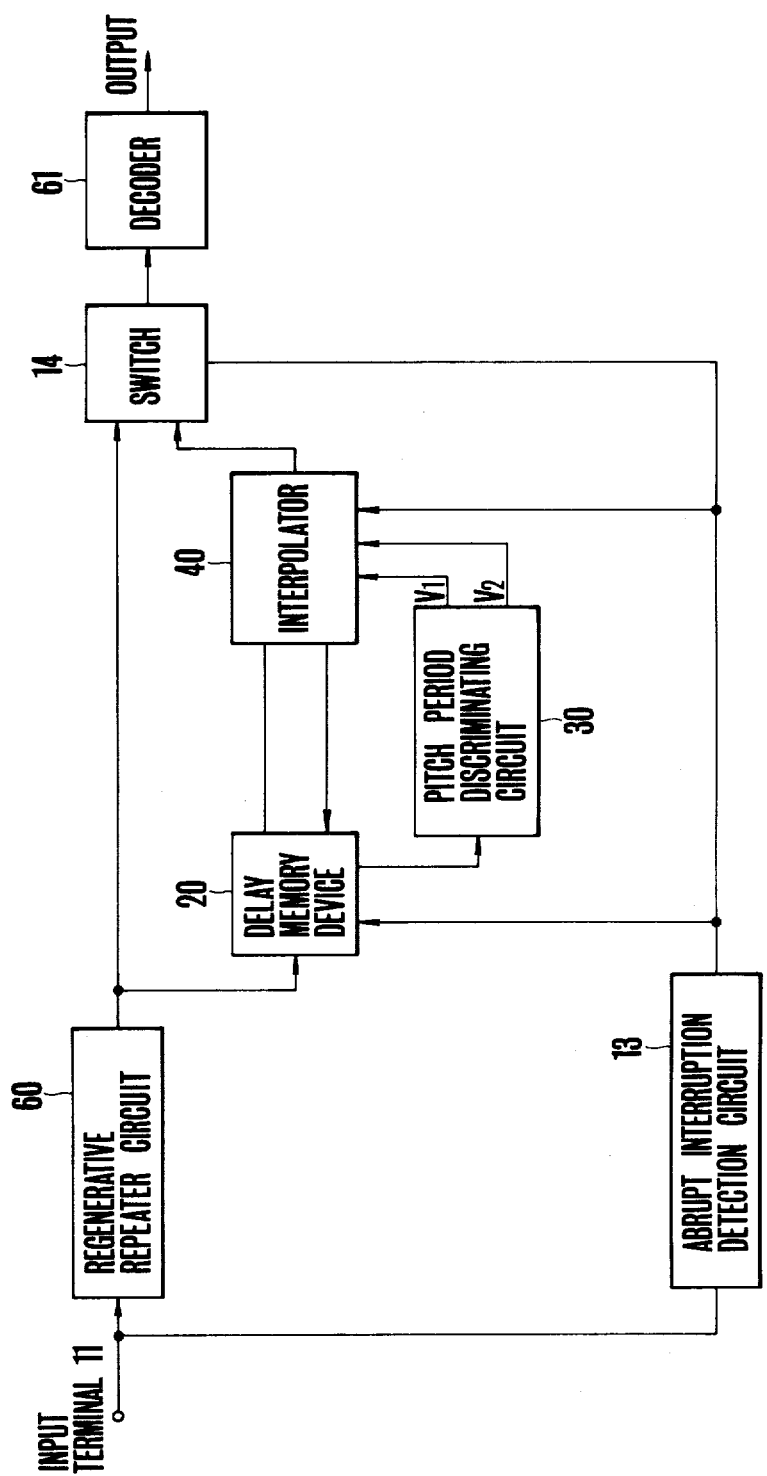

RECEIVER DEVICE HAVING A FUNCTION FOR SUPPRESSING TRANSIENT NOISES DURING ABRUPT INTERRUPTIONS

BACKGROUND OF THE INVENTION

The present invention relates to a receiver device having a function to suppress transient noises during abrupt interruptions originating from rapid fading phenomenon and the like in mobile communications carried out in automobiles, for example.

In mobile communication systems such as automobile telephone systems, mobile stations do not necessarily go through places where good communicating conditions prevail; when they go through downtown areas where buildings stand next to each other, the rapid fading phenomenon occurs. When this phenomenon occurs, there arises an abrupt interruption in the signal waves momentarily, for typically 0.1 to 30 mS, in the speech signals, and communication quality is remarkably deteriorated.

SUMMARY OF THE INVENTION

Accordingly, it is the principal object of this invention to provide a receiver device having a function of suppressing transient noises during instantaneous or abrupt interruptions.

Another object of this invention is to provide a receiver device which executes interpolating operations on receipt of the information of the abrupt interruptions which occur repeatedly during a short period of time.

According to one embodiment of this invention to achieve the purposes as above mentioned, there is provided a receiver device having the function of suppressing transient noises during the abrupt interruption comprising means for demodulating speech signals received at the input terminal of the device, means for storing, with a delay, speech signals of a prescribed period for a predetermined period of time, means for detecting an abrupt interruption and its period of the received speech signals, means for discriminating whether the speech signals stored in said delay memory means are periodic or non-periodic, an interpolator for creating the interpolating information during the abrupt interruption from the signals stored in the delay memory means under the control of said detection means by receiving the outputs of the discriminating means and the abrupt interruption detection means, and switch means which is adapted, under the normal condition, to receive and transmit signals from the demodulator to the output of the device and which is adapted, under the condition that the abrupt interruption detection means detects an abrupt interruption and the period thereof, to select signals from the interpolator and to transmit the selected signals to the output terminal of the device.

BRIEF DESCRIPTION OF THE DRAWINGS

The organization and operation of the receiver device having a function to suppress transient noises during abrupt interruptions together with other objects and advantages of this invention can be more fully understood from the following detailed description taken in conjunction with the accompanying drawings in which:

FIGS. 5 and 6 are block diagrams showing various modified embodiments of the present invention.

DESCRIPTION OF THE PREFERRED EMBODIMENT

Figure 1:
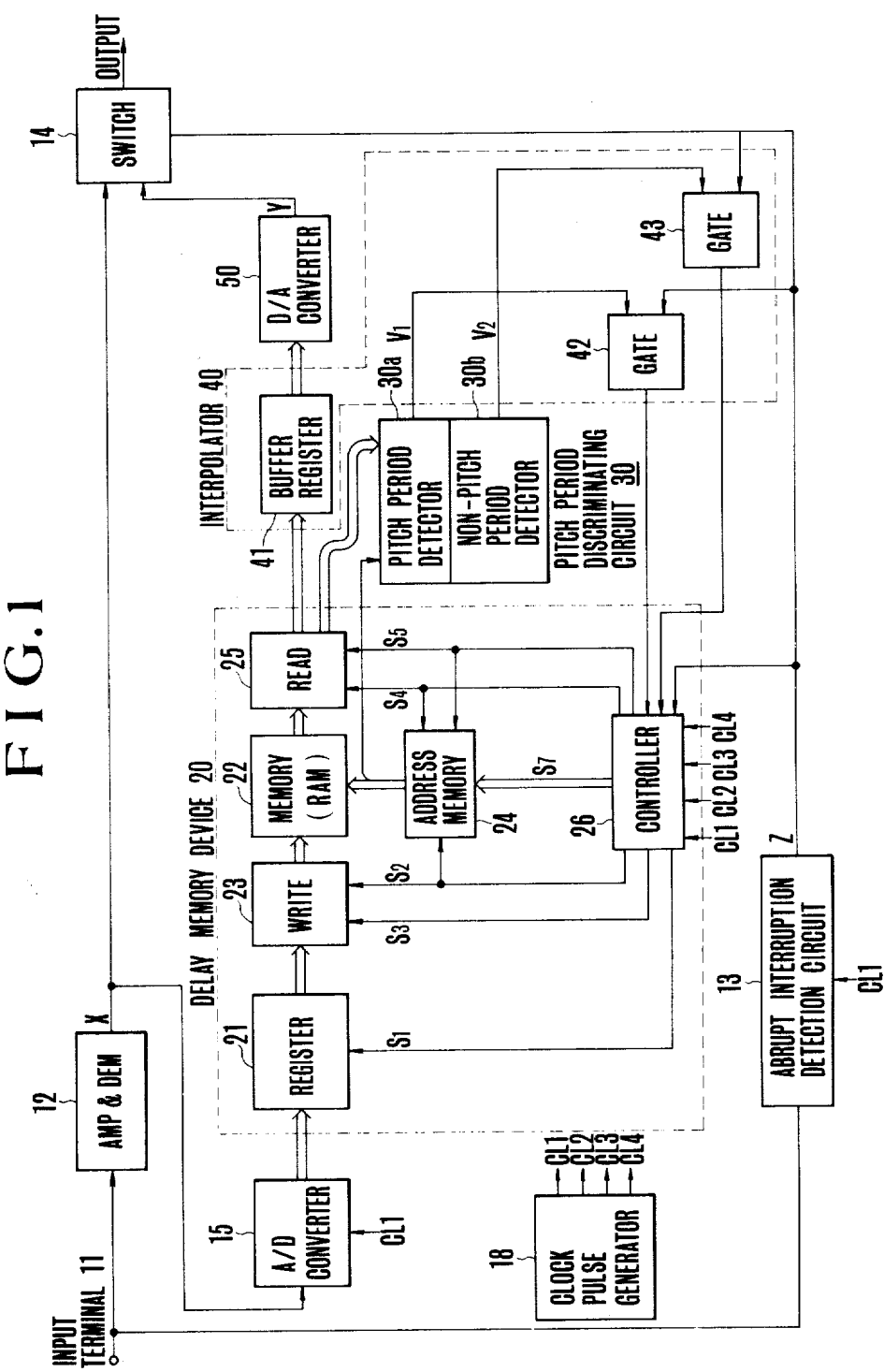
FIG. 1 is a block diagram showing one embodiment of the receiver device having a function to suppress transient noises during abrupt interruptions in accordance with the present invention.

FIG. 1 shows an embodiment of a radio receiver to suppress transient noises during abrupt interruptions according to the present invention. In the drawing, reference numeral 11 denotes an input terminal to which are supplied modulated analog signals (signals modulating voices by carrier) from mobile stations or base stations which have been FM, PCM or AM modulated. The path through which said modulated analog signals are received by the antenna (not shown) of the radio receiver and therefrom coupled to this input terminal 11 is known, and this path does not concern the present invention directly, thus the description therefor is eliminated.

The modulated analog signals coupled to the input terminal 11 are sent to an amplifier and demodulating circuit 12 and an abrupt or instantaneous interruption detection circuit 13. This abrupt interruption detection circuit 13 reacts only to the carrier power included in the modulated analog signals, or the received power. When the received power falls below the a predetermined level at a predetermined rate, the abrupt interruption is judged to have occurred, and the abrupt interruption detection circuit 13 generates an output signal Z, whereas when the received power rises above the predetermined level, it is judged that the abrupt interruption has ended or ceased, ceasing the output signal from the abrupt interruption circuit 13.

Figure 2:
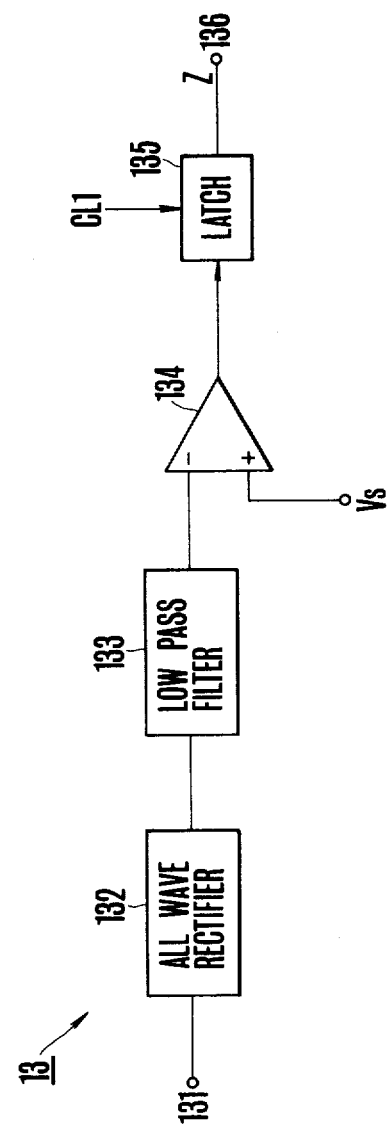
FIG. 2 is a block diagram showing one embodiment of the abrupt interruption detection circuit shown in FIG. 1.

FIG. 2 shows an embodiment of this abrupt interruption detection circuit 13. In the drawing, the modulated analog signals from the input terminal 11 are coupled to an all wave rectifier 132 via terminal 131 to be rectified there. The output of the rectifier is sent to a low pass filter 133 having a cut off frequency of about 500 Hz, and then further on to a negative input terminal of a comparator 134 comprising an operational amplifier. At the positive input terminal of the comparator 134 a reference voltage source Vs, is applied and the output from the comparator 134 is coupled to a latch circuit 135, which latches the output from the comparator 134 with clock pulse CL1 timing. The output of latch circuit 135 is coupled to an output terminal 136 as the output Z from this detection circuit 13.

The abrupt interruption detection circuit 13 discriminates that an abrupt interruption occurred at the moment the received power becomes, for instance, less than 0 dBμ in order to detect transient noises originating from the rapid fading phenomenon.

The latch circuit 135 shown in FIG. 2 can be of any type so long as it is a circuit to hold the output from the comparator 134 during the prescribed period of time. It is sufficient if it is a mere hold circuit in which case the clock control is not needed.

Figure 3:
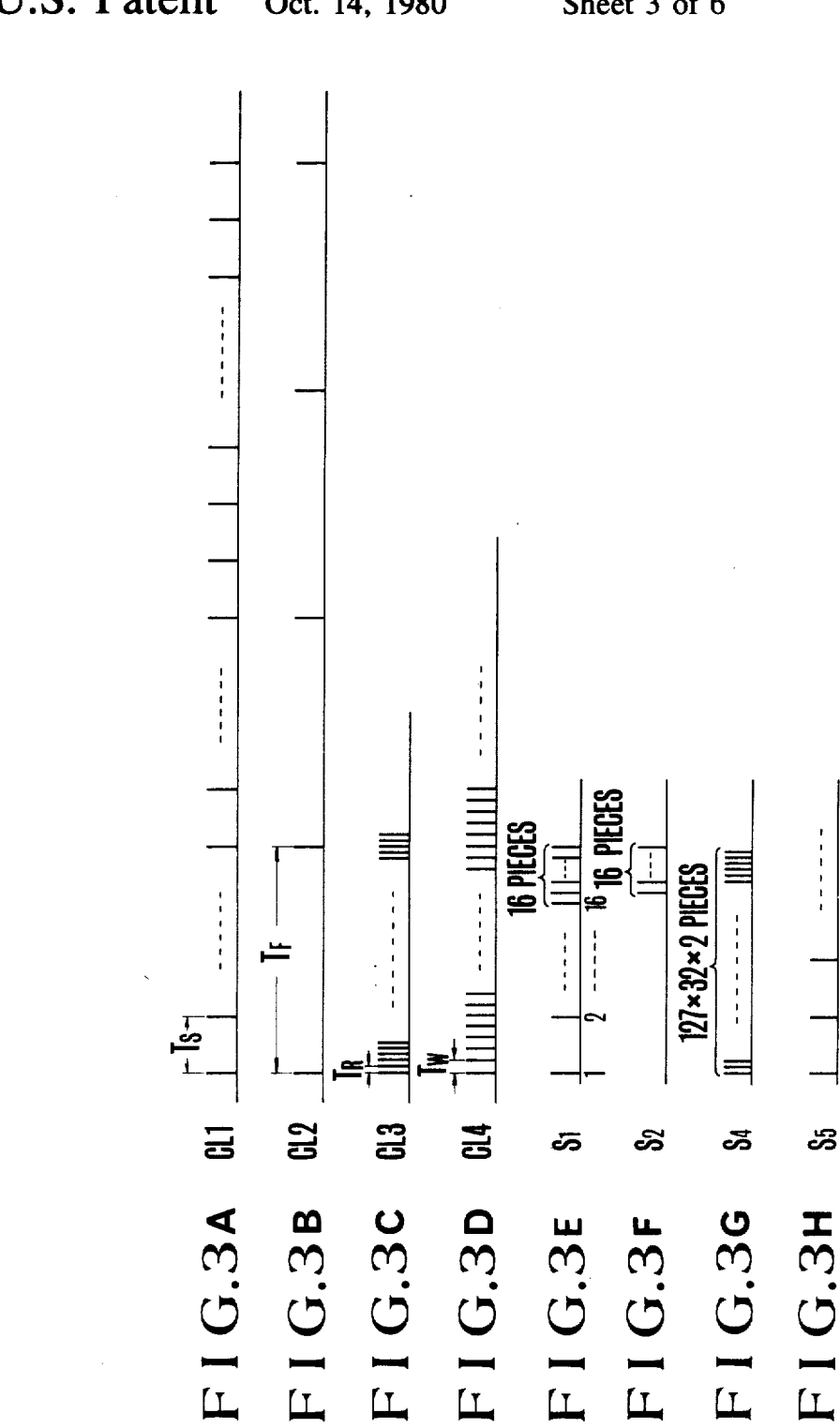
FIGS. 3A-H show various timing signals in waves to explain the operation of the device shown in FIG. 1.

The amplifier and demodulator circuit 12 demodulates the modulated analog input signals by a known method, and sends demodulated analog signals X to the switch 14 and also to the delay memory device 20 via an analog-digital converter or PCM coder 15. The PCM coder 15 samples the analog signals or speech signals with a predetermined sampling frequency fs (=1/Ts), where Ts is the selected sample, such as the frequency (signals of 8 kHz), and converts the value obtained to multi-bit digital speech signals of, for instance, 12, bits. The frequency signals used for performing the sampling operation are clock pulses CL1 generated from a clock pulse generator 18, as shown in FIG. 3A. Thus, the digital speech signals are sent to the delay memory device 20 the operation of which is described below.

The nature of the clock pulses sent out from the clock pulse generator 18 will now be explained. First, clock pulses sent out from the clock pulse generator 18 include the clock pulse CL1 of a sampling period $T_s$ shown in FIG. 3A as mentioned above. These clock pulse CL1 are used as sampling signals for the above mentioned analog-digital converter 15, as signals for writing in the register 21 of the delay memory device 20, and read signals for reading out data from the memory numeral 22 to the interpolator 42. In this embodiment, clock pulses CL1 have a frequency of 8 kHz.

The clock pulse generator 18 also generates clock pulses CL2 of a period $T_F$ shown in FIG. 3B. These clock pulses are used for determining the frame period of this device, and in this embodiment, it is determined to have a frame period 16 times longer than that of the clock pulses CL1, or $T_F = 16\ T_S$.

The clock pulse generator 18 also generates clock pulses CL4 having the period $T_W$ shown in FIG. 3D, which are used as read out signals when signals are read out from the register 21 of the delay memory device 20 and written into the memory 22. The period $T_W$ of these clock pulses CL4 should be of a short period to prevent influences on the read out from the register. In this embodiment it is determined as $$T_W = 1/128 \times 16/8000 \times 1/16 \text{ sec.}$$

The value "128" is a constant determined to detect the minimum value of the pitch frequency to be detected from the human speech.

The clock pulse generator 18 also generates clock pulses CL3 of a period $T_R$ as shown in FIG. 3C, which are used as the timing signals for reading out signals from the memory 22 of the delay memory device 20 to detect a pitch period. In the embodiment, it is determined as $$T_R = \frac{127}{128} \times \frac{16}{8000} \times \frac{1}{127 \times 32 \times 2} \text{ sec.}$$

The value "32" is a constant to determine data for the time which is at least about half of the longest period when detecting the pitch period in Average Magnitude Difference Function Pitch Extracting Method (AMDF method) to which reference will be made later.

The aforementioned delay memory device 20 comprises register 21 for receiving digital speech signals from the converter 15, a memory 22, a write circuit 23 for writing signals output from register 21 into the memory 22, an address memory 24 for storing the address information of the memory 22, a read circuit 25 for reading out the speech signals stored in the memory 22, and a controller 26 controlling operation of these elements.

The register 21 comprises a shift register to store consecutively the predetermined number of digital speech signals converted into PCM codes by the converter 15. This register 21 is so constructed that, for instance, 16 digital speech signals are stored serially, the storing operation being controlled by the control signal $S_1$ sent out from the controller 26 (FIG. 3E). In other words, the register 21 receives the digital signals from the converter 15 according to the aforementioned clock pulse CL1, and the contents of register 21 are sent to the write circuit 23 at the high rate of the clock pulse CL4 after storage of a group of 16 digital speech signals.

The write circuit 23 writes the signals read out from the register 21 into locations in the memory 22 designated by the address memory 24 sequentially. The write circuit 23 receives writing timing signals $S_2$ synchronized to the clock pulse CL4 and supplied from the controller 26 (shown in FIG. 3E). The write circuit 23 also receives control signals $S_3$ which are always generated unless an abrupt interruption is detected, which stop when the abrupt interruption does occur, and then which are then regenerated as soon as the interruption ceases. The memory 22 comprises, for instance, random access memory (RAM) and has a capacity to a quantity of signals which is about twice the maximum period of the speech. For example, the capacity of the memory 22 is 256 samples, and the signals sent under the control of the controller 26 via the write circuit 23 are written in the address location of the memory 22 designated by the address memory 24, while the sampling signals stored in the memory 22 in locations designated by the address memory 24 are read out sequentially via the read circuit 25. The read circuit 25 and the address memory 24 receive the control signals $S_4$, $S_5$ from the controller 26 and execute the read out operation from the memory 22. The control signals $S_4$ are used to send the content of the memory 22 to the pitch period discriminating circuit 30 to which reference will be made later, and control signals $S_4$ comprise pulses generated at a timing synchronized to the clock pulses CL3 of period $T_R$ shown in FIG. 3C and grouped in a group of $127 \times 32 \times 2$. The control signals $S_4$ are shown in FIG. 3G. The control signals $S_5$ are generated at a timing synchronized to the sampling pulses CL1 as shown in FIG. 3H and these signals are used to send the content of the memory 22 to the interpolator 40 to which reference will also be made later. Said signals $S_4$ comprise pulses grouped in 1 group of $127 \times 32 \times 2$ pieces.

The pitch period discriminating circuit 30 discriminates whether the signals read out at the timing shown in FIG. 3G and at the frame period from the memory 22 via the read circuit 25 are at the pitch period or not When they determine that the signals have the pitc. period, then the output $V_1$ is generated, whereas the output $V_2$ is generated when they have non-pitch period or no period.

This pitch period discriminating circuit 30 comprises a pitch period detector 30a which detects the period of a pitch and the non-pitch period detector 30b which detects the absence of the pitch period. These detectors respectively execute a detecting operation with use of the sampling information read out from the memory 22 via the read circuit 25 at the period of $$T_R = \frac{127}{128} \times \frac{16}{8000} \times \frac{1}{127 \times 32 \times 2} \text{ sec.}$$

in the known detection method. As the pitch period detector 30a, an average magnitude difference function pitch extractor using the average magnitifude difference function (AMDF) is used. This extractor seeks the absolute values in the difference signals between the delayed speech signals, and also the address value, $j=J_p$, where the total of these difference signals becomes minimum.

Accordingly, the total sum of the difference signals obtained in this embodiment is represented by the following formula.

$$S_j = \sum_{i=n}^{n+32} |X_i - X_{i-j}|$$

$S_j$: sum of absolute values of the difference signals between the sampled values $X_i$: Sampled value when the time is $iT_S$ $X_{i-j}$: Sampled value when the time is $iT_S - jT_S$ n: value for determining the time at a certain frame position 32: constant for determining the time which is at least about one half of the maximum period as mentioned above.

Therefore, the extractor seeks the relative address value $J_p$ corresponding to the reference sampling signal where the sum of the absolute values of the difference signals becomes minimum, and sends out the obtained value as the output $V_1$ for the pitch period.

The extractor is known as described in "Average Magnitude Difference Function Pitch Extractor" written by Myron J. Ross et al appearing on pages 353 to 362 of "IEEE TRANSACTIONS ON ACOUSTICS, SPEECH, AND SIGNAL PROCESSING" Vol. ASSP-22, No. 5, October 1974. Therefore, the detailed description thereof will not be given.

As the non-pitch detector 30b, an apparatus using an energy method which distinguishes the unvoiced or silence and voiced speech, or linear predictive coding (LPC) coefficient method is used. These methods are both well known and, for instance, described in "A Better Recognition Approach to Voiced-Unvoiced Silence Classification with Applicant to Speech Recognition" by Bishnu S. Atal et al, IEEE TRANSACTIONS ON ACOUSTICS, SPEECH, AND SIGNAL PROCESSING, Vol. ASSP-24, No. 3. June, 1976, pp 201-212. Reference in detail to these methods, therefore, will not be given. When the non-pitch detector 30b detects no pitch, then it automatically sends out the output $V_2$ to set the sampling signals to a pseudo pitch period up to a certain period of time $T_2$ (for instance 2 msec) preceding abrupt interruption. Accordingly, the output $V_2$ is a relative address value determined as against the reference sampling signals stored in the memory when the abrupt interruption occurred.

The interpolator 40 has a buffer register 41 to send the sampling signal or the content without phase delay to latter stages sent out from the memory 22 via the read circuit 25 of the delay memory device 20, and gate circuits 42, 43 for receiving the outputs respectively from the abrupt interruption detection circuit 13 to execute an "and" operation. The AND gate 42 sends out the output $V_1$ from the pitch period detector 30a of the pitch period discriminating circuit 30 to the controller 26 of the delay memory device 20 when the abrupt interruption output Z from the abrupt interruption detection circuit 13 is received. The AND gate 43 sends out the control output $V_2$ to the controller 26 of the delay memory device 20 when the output $V_2$ of the non-pitch detector 30b and the abrupt interruption output Z from the abrupt interruption detection circuit 13 are received.

When the controller 26 receives the control outputs $V_1$ and $V_2$ from these gates 42, 43, it causes the read circuit 25 to read sequentially the sampling signals of the memory 22 based on the relative address information contained in these control outputs. In other words, the signals $S_5$ with the same timing as the clock pulse CL1 shown in FIG. 3H are sent to the read circuit 25. The address memory 24 designates the predetermined address based on the address information concerning the pitch period or pseudo pitch period received from the controller 26. Accordingly, the read circuit 25 sequentially reads the sampling signals of the address in the memory 22 thus designated by the address memory 24 at the sampling period of $T_S$, and sends them to the buffer register 41 of the interpolator 40. When relative address $J_p$ signals corresponding to the pitch period are sent to the controller 26 from the gate 42, following address designating information is sent to the address memory 24. That is, the memory 22 is assumed to store the information sequentially from the larger address number to the smaller one, and the latest information is assumed to be stored at the number $M_1$. The controller 26, then, determines at which sampling number of the frame the abrupt interruption occurred when the aforementioned abrupt interruption occurred and the relative address $J_p$ signal was received from the gate 42. Assuming that this occurred at the 4th address, the address control information $S_7$ is sent from the controller 26 to the address memory 24 to begin the read out from the number $(M_1+J_p-4)$. The controller, thereafter, designates sequentially the numbers $(M_1+J_p-4)$ to $M_1$ to the address memory 24, and then again designate numbers starting with $(M_1+J_p)$ toward $M_1$. Such an operation of the address memory 24 and the controller 26 is performed in the operation of the ordinary central processor and the memory, and is well known in the art, thereby eliminating the need for further explanation.

Figure 4:
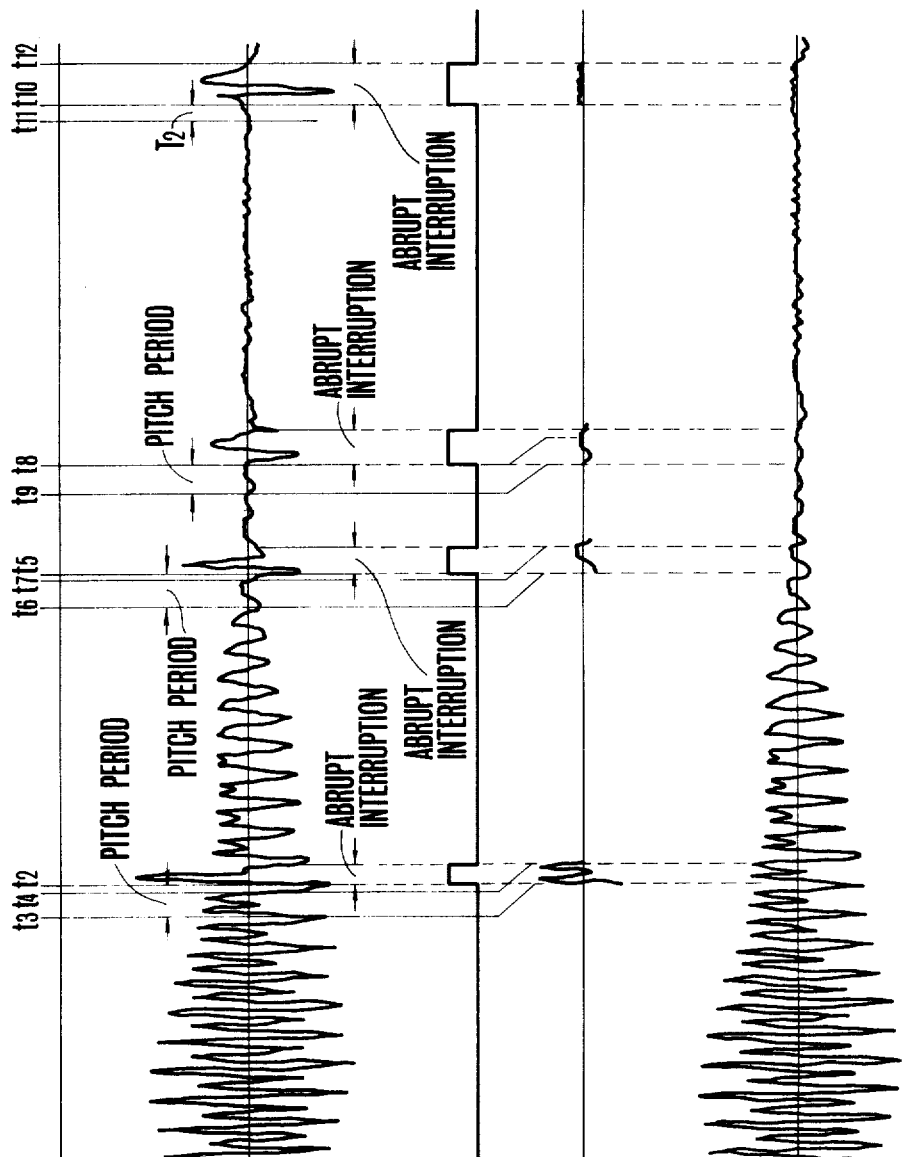
FIGS. 4A-D show the relation between various wave forms of signals and of timing waves to explain the operation of the device shown in FIG. 1 during the abrupt interruption.

The output from the buffer register 41 of the interpolator 40 is sent to the digital-analog converter 50 and decoded into analog signals here. The output Y then is sent to the switch means 14. Now, suppose the normal modulated analog input signal which does not include the abrupt interruption is fed to the input terminal 11. In this case, the abrupt interruption detection circuit 13 does not operate and therefore no output Z is sent out. The switch 14, therefore, relays the output X from the amplifier and demodulator circuit 12 without modification to the latter stages. Accordingly, the modulated analog input signal fed to the input terminal 11 is demodulated by the amplifier and demodulator circuit 12, and the demodulated output or analog speech signal X such as the output shown for the time $t_1-t_2$ of FIG. 4A is sent via switch 14 and the output terminal without modification to a latter stage such as a speaker via a low frequency amplifier. The output of the switch 14 is shown in FIG. 4D.

PCM encoder 15 samples the output of the amplifier and demodulator circuit 12 at $T_S = 1/8000$ sec based on the clock pulse CL1 and supplies the output to the register 21 of the delay memory device 20. The register 21 serially stores the output of the encoder 15 under the control of the control signals $S_1$ supplied from the controller 26 at the same timing as the sampling operation.

When a group of 16 sampling signals is stored in register 21, the content is read at a high speed sequentially from this register 21 at the same timing as the clock pulse CL4 by the control signals $S_1$ until the time the next sampling operation is initiated.

The write circuit 23 sequentially writes the content read out from the register 21 under the control signals $S_2$ supplied from the controller 26 at the same timing as the clock pulse CL4 in the address of the memory 22 designated by the address memory 24.

When not detecting abrupt interruptions, the controller 26 sends the control signals $S_4$ to the read circuit 25 and the address memory 24 as shown in FIG. 3G, which causes the read circuit 25 to sequentially read the memory 22 at the period $T_R$ and to send the output to the pitch period discriminating circuit 30. The pitch period discriminating circuit 30 detects j where Sj is the minimum by the following formula, $$Sj = \sum_{i=n}^{n+31} |Xi - Xi - j|$$

by the average magnitude difference function (AMDF) method. This calculation is executed while $T_C = (127/128) \times (16/8000)$ sec. Thus, j where Sj is the minimum is detected, and the combination of Xi and $XI - j$ which obtained this minimum value is discriminated as representing the pitch period, and the difference in relative address of Xi and $Xi - j$ is memorized as the pitch period information. This value, then, is output as the output $V_1$. From the non-pitch detector 30b of the pitch period discriminating circuit 30 is output the pseudo pitch period output $V_2$ when the sampling signals presently stored in the memory 22 is non-pitch.

When an abrupt interruption occurs at the time $t_2$ in FIG. 4A, the abrupt interruption detection circuit 13 detects this occurrence. The detected output Z (see FIG. 4B) is then sent to the controller 26 of the delay memory device 20, the gates 42, 43 of the interpolator 40 and the switch means 14. The controller 26, when it receives the output Z from the abrupt interruption detection circuit 13, sends the control signals $S_3$ to the write circuit 23 from then on so as to prevent the register 21 from executing, the write operation in memory 22. At the same time, the information $V_1$ or $V_2$ concerning the pitch period of the sampling signals stored in the memory 22 immediately before the abrupt interruption occurred is sent out from either one of the gates 42, 43 of the interpolator 40. From the wave form shown in FIG. 4A, for instance, the pitch period of the time $t_3-t_4$ is detected when the abrupt interruption occurred at the time $t_2$, and the output $V_1$ from the pitch period detector 30a concerning the pitch period is sent to the controller 26. Then, the controller 26 discriminates by the above mentioned method from which address of the content stored in the memory 22 should the information be taken out based on the output $V_1$, and sends the signals $S_7$ to the address memory 24. The controller 26 also sends the control signals $S_5$ (see FIG. 3H) to the read circuit 25 and the address memory 24. Accordingly, the read circuit 25 sequentially reads the sampling signals concerning the wave forms shown by the time $t_3-t_4$ in FIG. 4A from the memory 22 and sends them to the buffer register 41 of the interpolator 40. The buffer register 41 in turn sends its output to PCM decoder 50 to be decoded therein and sent further to the switch means 14 as interpolated signals in the form of analog waves shown in FIG. 4C. The switch means 14 outputs this interpolated signals Y following the signal received from the demodulating circuit 12 up to the time immediately preceding the abrupt interruption. Thus, the output signal from the switch means 14 is as shown in FIG. 4D.

Interpolation continues until the output Z ceases to be sent out from the abrupt interruption detection circuit 13, and when the interruption ceases to exist, the original conditions are restored, the switch means 14 sending the demodulation signals X as an output to the latter stage. The interpolation may otherwise be designed to continue until the initiation of the subsequent frame, in which case the latch 135, for example, receives the clock CL2 in place of the clock CL1.

FIG. 4A also illustrates the instance where an abrupt interruption occurs at the time $t_5$ and the pitch period signals at the time $t_5-t_6$ are used as interpolating signals, and the instance where the abrupt interruption occurs at the time $t_8$ and the pitch period signals at the time $t_9-t_8$ are used as interpolating signals. In any of the cases, the interpolation operation similar to that performed at the time $t_2$ mentioned above is executed. When an abrupt interruption occurs and the signals immediately preceding this are non-pitch, the operation will be as described below corresponding to the abrupt interruption occurring at the time $t_{10}$ of FIG. 4A. Demodulated analog signals X immediately preceding the abrupt interruption at the time $t_{10}$ have no pitch periods. Accordingly, when the sampled values of these signals are stored in the memory 22 and the pitch period discriminating circuit 30 discriminates the pitch period, the non-pitch period detector 30b sends out the output $V_2$. When the controller 26 learns at the time $t_{10}$ of the abrupt interruption from the output Z (at the time $t_{10}-t_{12}$ in FIG. 4B) from the abrupt interruption detection circuit 13, the controller 26 sends out the controlling signals $S_3$ to the write circuit 23 to suspend writing in the memory 22 from then on. The controller 26 at the same time sends out the control signals $S_7$ to the address memory 24 so as to allow the read out of the information stored in the memory 22 as the sampling signals during the time $T_2$ immediately preceding the abrupt interruption. The controller 26 further sends out the control signals $S_5$ (FIG. 3H) to the read circuit 25 to read sequentially the sampling values corresponding to the analog signals at the time $t_{11}-t_{10}$ of the memory 22 to further send them to the switch means 14 as interpolating signals Y (at the time $t_{11}-t_{10}$ in FIG. 4C) via the register 41 of the interpolator 40 and D/A converter 50.

The interpolating operation as above mentioned having been executed, the input waveforms to the receiver device (FIG. 4A) are corrected as shown in FIG. 4D to be sent out further to the latter stages such as the low frequency amplifier, the speaker, etc. In this embodiment, since interpolation is conducted based on detected pitch period, connection between the normal signal and the interpolating signal becomes smooth and sufficiently satisfactory analog signals where the noise has beem suppressed are obtained.

Figure 5:
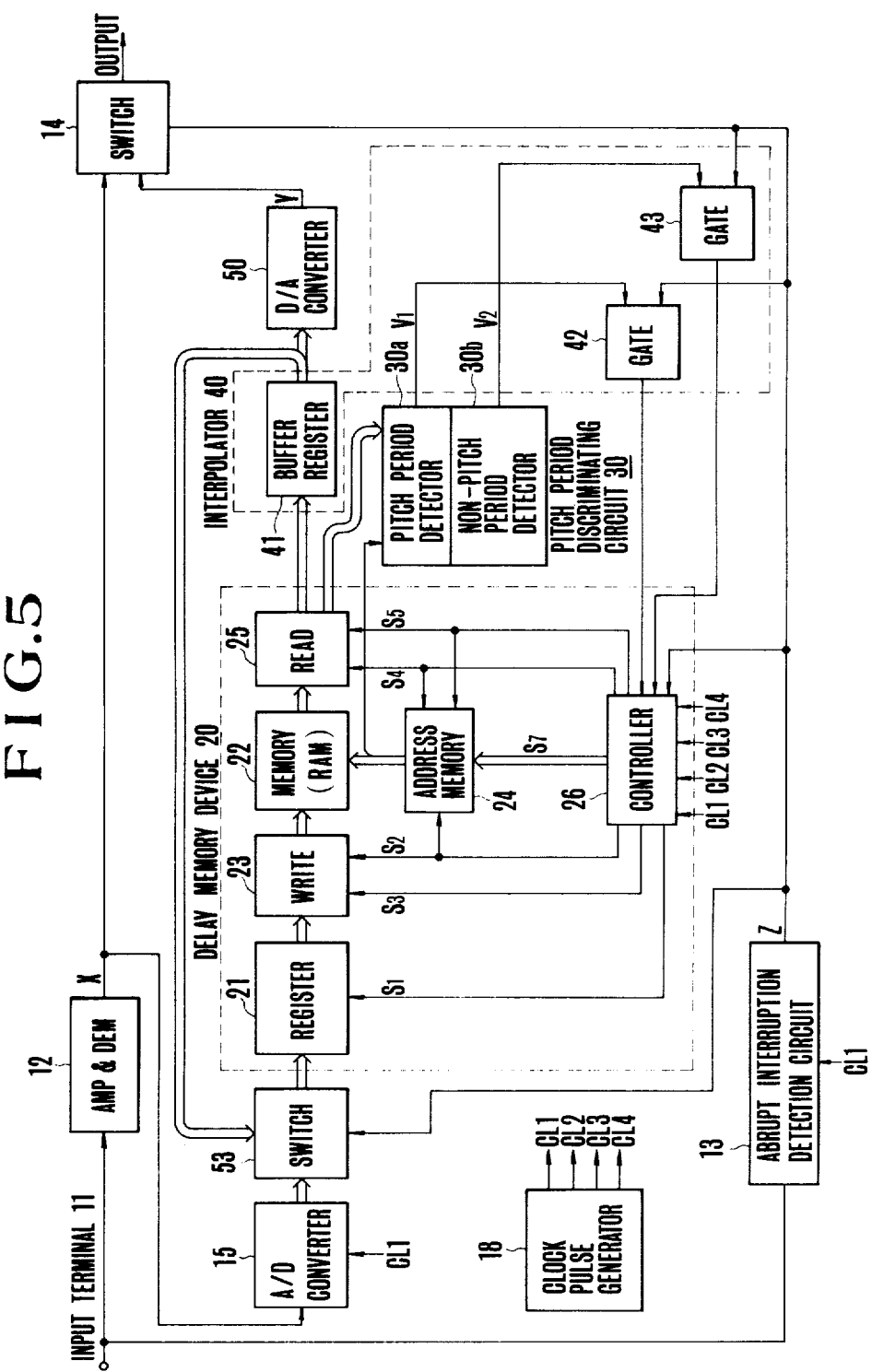

The present invention is naturally not to be limited to the above mentioned embodiment, but various adaptations and modifications are feasible. For instance, FIG. 5 shows an embodiment where a switch means 53 is provided between the A/D converter 15 and the delay memory device 20 of FIG. 1, the switch means 53 supplying the output from the A/D converter 15 to the register 21 of the delay memory device 20 without modification if the output Z from the abrupt interruption detection circuit 13 is not supplied. When the output Z is supplied, then it switches to supply the output from the buffer register 41 of the interpolator 40 to the register 21. This will prevent the samples of instantaneous interruptions noise occurring again during the interpolation of the previous interruption from being placed in the memory 22. In this case, the true signals alone will be used as the interpolating signals. Since the structure and operations of various parts other than above are the same as that of FIG. 1, no further description will be made.

When the signals supplied to the input terminal 11 of FIG. 1 are digital signals such as PCM digital signals, the circuit is constructed as shown in FIG. 6. Differences between the two are that a regenerative repeater circuit 60 to amplify and form the digital signals is used instead of the amplifier and demodulating circuit 12 of FIG. 1, A/D converter 15 and D/A converter 50 of FIG . 1 are removed, and a decoder circuit 61 is provided on the output side of the switch means 14. Thus, the abrupt interruption detection circuit 13 and the switch means 14 respectively process digital signals instead of analog signals of FIG. 1. The structure mentioned above and shown in FIG. 6 will also eliminate as in FIG. 1 transient noises caused by rapid the fading phenomenon or noises during the abrupt interruption in the mobile communication system. Although RAM was used as the delay memory circuit in this embodiment, other known memory elements such as CCD can be used interchangeably.

A/D converter 15 of FIG. 1 may be placed before the point where the output from the demodulating circuit 12 is branched to the delay circuit 20 and the switch means 14. In this case, D/A converter 50 of FIG. 1 is positioned on the output side of the switch means 14.

The present invention is useful in suppressing the transient noises during the rapid fading phenomenon in mobile communication systems, but it may also be used in suppressing the noises generating in the mobile communication system when the mobile station intersects adjacent zones to switch zones.

What is claimed is:

1. A receiver device having a function of suppressing noises during abrupt interruptions comprising:
    a demodulator for demodulating speech signals received at the input terminal of the device;
    memory means for storing, with a delay, the demodulated speech signals of a prescribed period for a predetermined time;
    means for detecting an abrupt interruption and its period of the received speech signals;
    means for discriminating whether the speech signals stored in said delay memory means are periodic or non-periodic;
    an interpolator for creating interpolating information during the abrupt interruption from signals stored in the delay memory means under the control of said detection means by receiving the outputs from said discriminating means and the abrupt interruption detection means; and
    switch means which is adapted, under the normal condition, to receive and transmit signals from the demodulator to the output of the device, while it is adapted, under the condition that the abrupt interruption and the period thereof is detected, to select signals from the interpolator and to transmit the selected interpolating signals to the output terminal of the device.

2. A receiver device according to claim 1 wherein a further switch means is provided between the demodulator and the delay memory means, said switch means acting to pass the output from the demodulater when the abrupt interruption detection means does not detect abrupt interruptions, and to send the output from the delay memory means to its input side when said detection means detects an abrupt interruption.

3. A receiver device according to claim 1 wherein said speech signals for the demodulator are modulated analog speech signals, and wherein there is provided an analog-digital converter between the demodulator and the delay memory means for sampling the output of the demodulator with first clock pulses, and a digital-analog converter between the interpolator and the output terminal.

4. A receiver device according to claim 3 wherein said delay memory means comprises a first register having a capacity to receive the output from said analog-digital converter and to store a predetermined number of samples, a random access memory means to receive the output from said register, write means for performing a write operation to said first register at a first rate substantially equal to the sampling rate of the analog-digital converter and for transferring the information from said first register to said random access memory means at a high speed second rate not affecting said write operation, and means for cyclicly transferring stored samples from said random access memory means to said discriminating means at a high speed third rate under said normal condition and for sending signals from said random access memory means to said interpolator at said first rate based on the output from the discriminating means when detecting the abrupt interruption.

5. A receiver device according to claim 1 wherein said speech signals for the demodulator are modulated digital speech signals, and wherein there is provided a digital-analog converter on the output side of the switch means.

6. A receiver device according to claim 1 wherein said abrupt interruption detection means comprises means for rectifying the received signals, a low pass filter for receiving the output from said rectifier, a comparator for comparing a reference value with the output from said low pass filter, and means for holding the output from said comparator for a predetermined period of time.

7. A receiver device having a function of suppressing transient noises during abrupt interruptions comprising:
    means for regenerating and repeating the received speech signals;
    memory means coupled to said means for regenerating and repeating for storing with a delay, speech signals of prescribed period for a predetermined period of time;
    means for detecting an abrupt interruption and its period of the received speech signals;
    means for discriminating whether the speech signals stored in said delay memory means are periodic or non-periodic;
    an interpolator for creating an interpolating information during the abrupt interruption from the signals stored in the delay memory means under the control of said detection means by receiving the outputs from said discriminating means and the abrupt interruption detection means; and switch means which is adapted, under the normal condition, to receive and transmit signals from the regenerative repeater to the output of the device, while it is adapted, under the condition that the abrupt interruption and the period thereof is detected, to select signals from the interpolator and to transmit the selected interpolating signals to the output terminal of the device.

* * * * *